United States Patent
Chen

[19]

[11] Patent Number: 5,885,866
[45] Date of Patent: Mar. 23, 1999

[54] SELF-REGISTERED CYLINDRICAL CAPACITOR OF HIGH DENSITY DRAMS

[75] Inventor: Min-Liang Chen, Hsinchu, Taiwan

[73] Assignee: Mosel Vitelic Inc., Hsinchu, Taiwan

[21] Appl. No.: 873,243

[22] Filed: Jun. 11, 1997

[30] Foreign Application Priority Data

May 13, 1997 [TW] Taiwan .................................. 85112106

[51] Int. Cl.$^6$ ............................................. H01L 21/8242
[52] U.S. Cl. ........................................... 438/253; 438/255
[58] Field of Search ..................... 438/253–256, 438/293–296

[56] References Cited

U.S. PATENT DOCUMENTS

| | | |
|---|---|---|
| 5,206,183 | 4/1993 | Dennison . |
| 5,266,514 | 11/1993 | Tuan et al. . |
| 5,445,986 | 8/1995 | Hirota . |
| 5,607,874 | 3/1997 | Wang et al. . |
| 5,686,337 | 11/1997 | Koh et al. . |

*Primary Examiner*—Jey Tsai
*Attorney, Agent, or Firm*—Bacon & Thomas, PLLC

[57] ABSTRACT

A method of fabricating the self-registered cylindrical capacitor of high density Dynamic Random Access Memory (DRAM) cells. A first polysilicon layer which is the storage node of the capacitor is deposited overlaying the entire silicon substrate surface. A dielectric layer is formed overlaying the first polysilicon layer. Then, the dielectric layer and the first polysilicon layer are polished by CMP to form the cylindrical shape capacitor storage nodes. The self-registered cylindrical polysilicon storage nodes are formed by CMP technique without using the extra mask as the conventional method would. The first polysilicon storage nodes are treated by hot phosphoric acid ($H_3PO_4$) to form the rugged surface that can tremendously increase the surface area of the capacitor. Therefore, the cylindrical capacitor storage node of the DRAM capacitor of this method has much greater surface area so as to increase the capacitance value of the DRAM capacitor, that can achieve high packing density of the integrated circuit devices.

18 Claims, 11 Drawing Sheets

SELF-REGISTERED CYLINDRICAL CAPACITOR OF HIGH DENSITY DRAMS

BACKGROUND OF THE INVENTION (a) Field of the Invention

The present invention relates to a fabricating the capacitors of dynamic random access memory (DRAM) cells, and more particularly to the self-registered cylindrical capacitor of high density DRAMs.

(b) Description of the Prior Art

A DRAM cell comprises a metal-oxide-semiconductor field effect transistor (MOSFET) and capacitors which are built in a semiconductor silicon substrate. There is an electrical contact between the source of a MOSFET and the storage node of the adjacent capacitor, forming a memory cell of the DRAM device. A large number of memory cells make up the cell arrays which combine with the peripheral circuit to produce stack DRAMs.

In recent years, the sizes of the MOSFETs and capacitors have become continuously smaller so that the packing densities of these DRAM devices have increased considerably. For example, a number of semiconductor manufacturing companies in the world have already begun mass production of 16 M bit or even 64 M bit DRAMs. As the sizes of the capacitors become smaller, the capacitance values of the capacitors decrease, which reduces the signal to noise ratio of the DRAM circuits, causing performance problem. In order to maintain or even increase the value of the capacitance for smaller size capacitors, increasing the surface area of the polysilicon storage nodes or reducing the thickness of the capacitor dielectric layer is necessary.

Within the prior art, various shapes of capacitor structures have been used to address this issue. For example, U.S. Pat. No. 5,021,357 to Taguchi et al. (the entire disclosure of which is herein incorporated by reference) provides a method of fabricating a fin structure capacitor electrode. Another U.S. Pat. No. 5,278,091 to Fazen et al. (the entire disclosure of which is herein incorporated by reference) develops a process to manufacture a crown stacked capacitor structure. These capacitor structures can increase the surface area of the capacitor storage node, however the processes are too complicated to be practically employed for mass-production.

The present invention discloses a novel method of modifying the capacitor structure of high density DRAMs that further increase the surface area of the capacitor.

SUMMARY OF THE INVENTION

According, it is a primary object of the present invention to provide a method for preparing a DRAM cell with greater capacitance per unit area.

It is another object of the present invention to provide a method of fabricating the self-registered cylindrical capacitor of the density DRAMs.

It is a further object of the present invention to provide a method which reduces the number of lithography processing steps to manufacture the high density DRAMs.

These objects are achieved by the fabricating process described below.

First, a field oxide layer for isolation is formed on the surface of a silicon semiconductor wafer. Next, the electrical device structures such as MOSFETs are formed in and on the silicon substrate. A first dielectric layer is also formed, and then patterned by the conventional lithography and plasma etching techniques to form the bitline contacts. Thereafter, the polysilicon/tungsten silicide bitlines are formed.

Next, a second and a third dielectric layer are sequentially formed overlaying the polysilicon/tungsten suicide bitlines, then the third dielectric layer is planarized by the chemical polishing (CMP) technique. The first, second and third dielectric layers are etched to form the node contact window where the storage node of the capacitor is electrically contacted with a source region of the MOSFET.

Next, a first polysilicon layer which is the storage node of the capacitor is deposited overlaying the entire silicon substrate surface. The fourth dielectric layer is then formed overlaying the first polysilicon layer and filling into the node contact window. Then, the third, fourth dielectric layers and the first polysilicon layer are polished by CMP to form the cylindrical shape capacitor storage nodes. The cylindrical polysilicon storage nodes are formed by CMP technique to self-align without using the extra mask as the conventional method would that is one of the key points of the present invention.

Next, the remaining of the third and fourth dielectric layers are removed by hydrofluoric acid. The first polysilicon storage nodes are then treated by hot phosphoric acid ($H_3PO_4$) to form the rugged surface that can tremendously increase the surface area of the capacitor. This is the most important step of the present invention.

Finally, the capacitor dielectric layer and the second polysilicon top plate of the capacitor are formed by standard integrated circuit technologies. Therefore, a self-registered cylindrical capacitor structure of the high density DRAMs according to the present invention is accomplished.

BRIEF DESCRIPTION OF THE DRAWINGS

The accompany drawings forming a material part of this description, there is shown.

DESCRIPTION OF THE PREFERRED EMBODIMENTS

Figure 1:
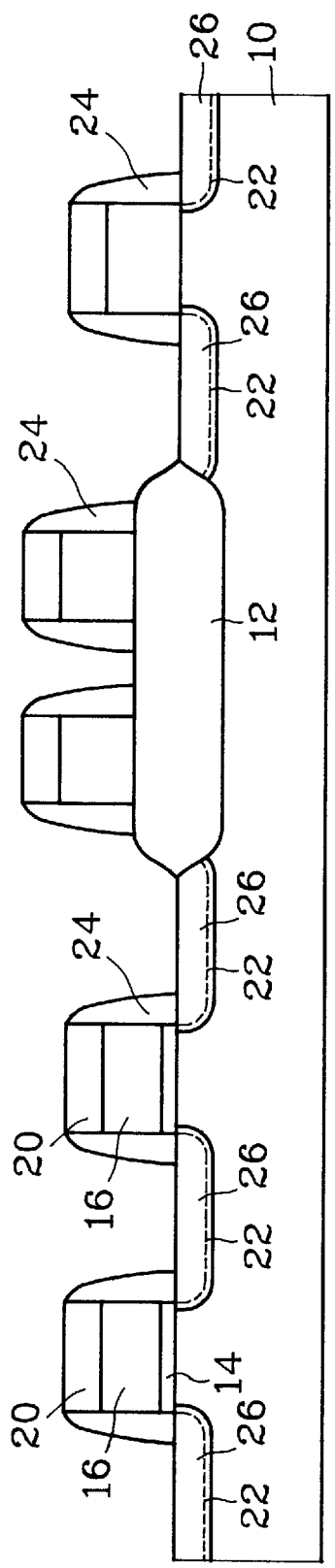
FIG. 1 is a cross sectional view of integrated circuit after the MOSFET structure is formed.

The invention discloses herein is directed to a method of fabricating the capacitor storage nodes of DRAMs. The drawing figures illustrate a partially completed integrated circuit device. In the following description, numerous details are set forth in order to provide a thorough understanding of the present invention. It will be appreciated by one skilled in the art that variations of these specific details still achieve the results of the present invention. In other instance, well-known processing steps are not described in detail in order not unnecessarily to obscure the present invention.

Referring now more particularly to FIG. 1, there is shown a portion of partially completed Metal-Oxide-Semiconductor Field Effect Transistors (MOSFETs). First, a field oxide region 12 is formed for isolation on a semiconductor silicon substrate 10. The thickness of the field oxide 12 is about 3000 to 6000 Angstroms. Next, MOSFETs which are consist of gate oxide 14, gate electrodes 16, cap oxide layers 20, N⁻ lightly regions 22, spacers 24 and N⁺ source/drain regions 26 are also formed on the silicon substrate 10.

The gate oxide layer 14 which is grown by thermal oxidation of the silicon substrate 10 in an oxygen-containing ambient at a very high temperature has a thickness about 50 to 200 Angstroms. The gate 16 is usually made of polysilicon or tungsten suicide which is formed by low pressure chemical vapor deposition (LPCVD) technique. The thickness of the gate 16 is about 1000 to 3000 Angstroms. The N⁻ lightly doped regions 22 which are formed by ion implantation technique, is preferably doped with phosphorus ($p^{31}$) ions, with an implantation dosage of 1E13 to 5E14 $CM^{-2}$, and an implantation energy of 20 to 50 KeV. The N⁺source/drain regions 26 are also formed by ion implantation technique, are preferably doped with arsenic ($As^{75}$) ions, with an implantation dosage of 1E14 to 5E16 $cm^{-2}$, and an implantation energy of 20 to 90 KeV.

Figure 2:
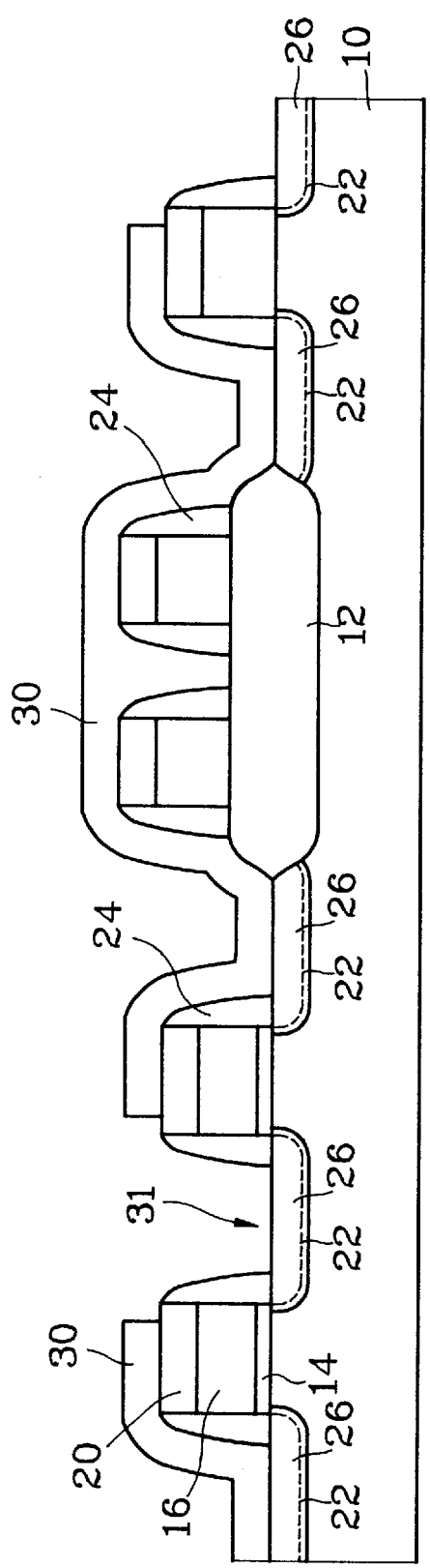
FIG. 2 is a cross sectional view of integrated circuit after the first dielectric layer is deposited and patterned.

Referring now to FIG. 2, the first dielectric layer 30 is deposited over the entire silicon substrate surface. Then, the first dielectric layer is patterned by the conventional lithography and plasma-etching techniques to form the bitline contacts 31 above the drain regions 26 of the MOSFETs. The first dielectric layer 30 is usually made of undoped silicon dioxide ($SiO_2$) by LPCVD with reactant gases of silane or TEOS. The thickness of the first dielectric layer is about 1000 to 2000 Angstroms. The first dielectric 30 plasma etching process can use magnetic enhanced reactive ion etching (MERIE), electron cyclotron etching (ECR) or reactive ion etching (ECR) methods with reactant fluoride gases such as $CF_4$ and $CHF_3$.

Figure 3:
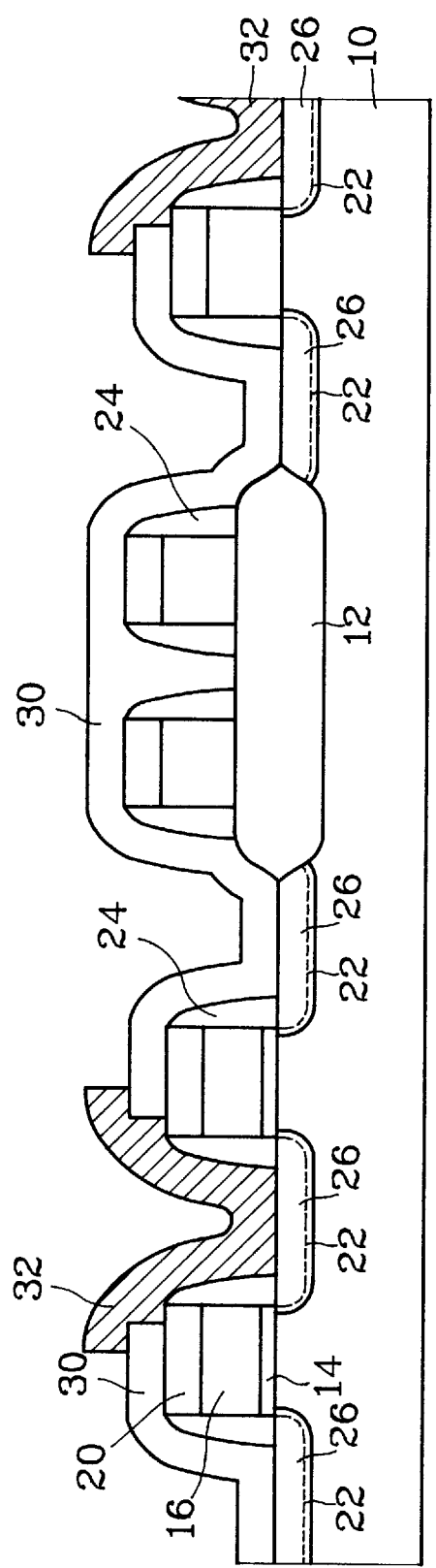
FIG. 3 is a cross sectional view of integrated circuit after the polysilicon/tungsten silicide bitlines are formed.

Referring now to FIG. 3, the bitlines 32 are formed over the bitline contacts 31. The bitlines 32 are usually made of polysilicon/tungsten silicon ($WSi_x$) double layer (or so called W-polycide). The thickness of the polysilicon and tungsten silicon layers are about 500 to 1500 Angstroms each layer.

Figure 4:
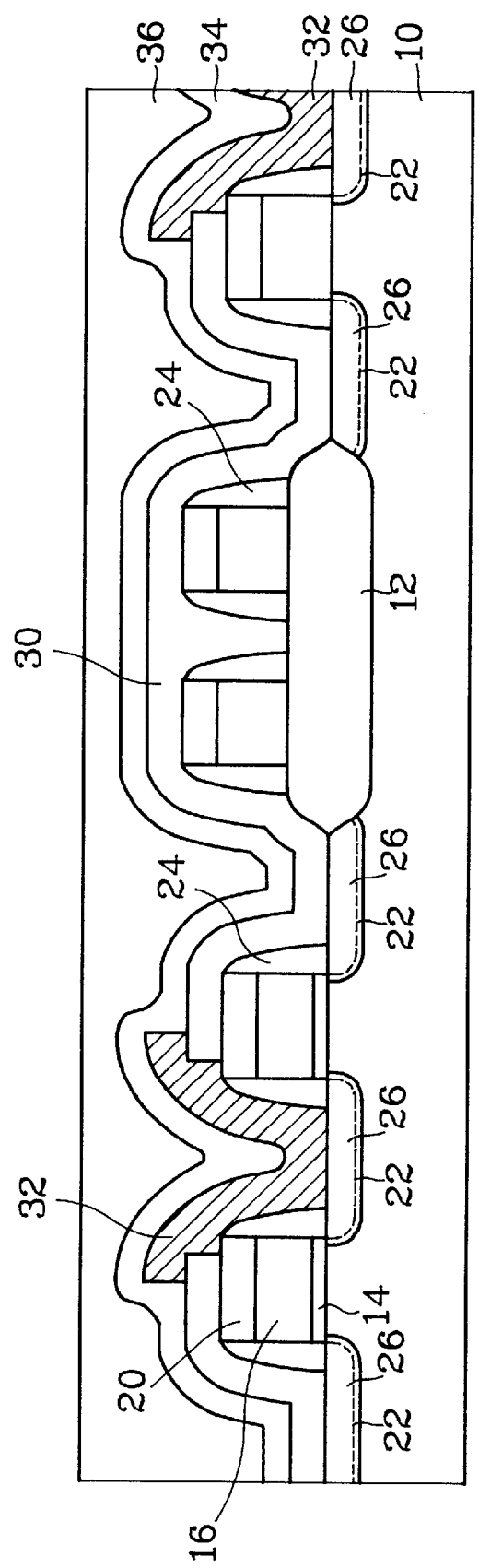
FIG. 4 is the cross sectional view of integrated circuit after the second and third dielectric layers are formed.

Referring now to FIG. 4, the second 34 and third dielectric 36 layers are sequentially deposited overlaying the W-polycide bitlines 32 and entire silicon substrate surface. Thereafter, the third dielectric layers 36 are planarized by either thermal flow etchback or chemical mechanical polishing (CMP) methods. The second dielectric layer 34 which is also made of undoped silicon dioxide, has a thickness of 1000 to 2000 Angstroms. The third dielectric layer 36 is usually using Boronphosphosilicate glass (BPSG) or neutral silicate glass (NSG) which are formed by atmosphere CVD (APCVD) technique. The thickness of the third dielectric layer 36 is about 3000 to 6000 Angstroms.

Figure 5:
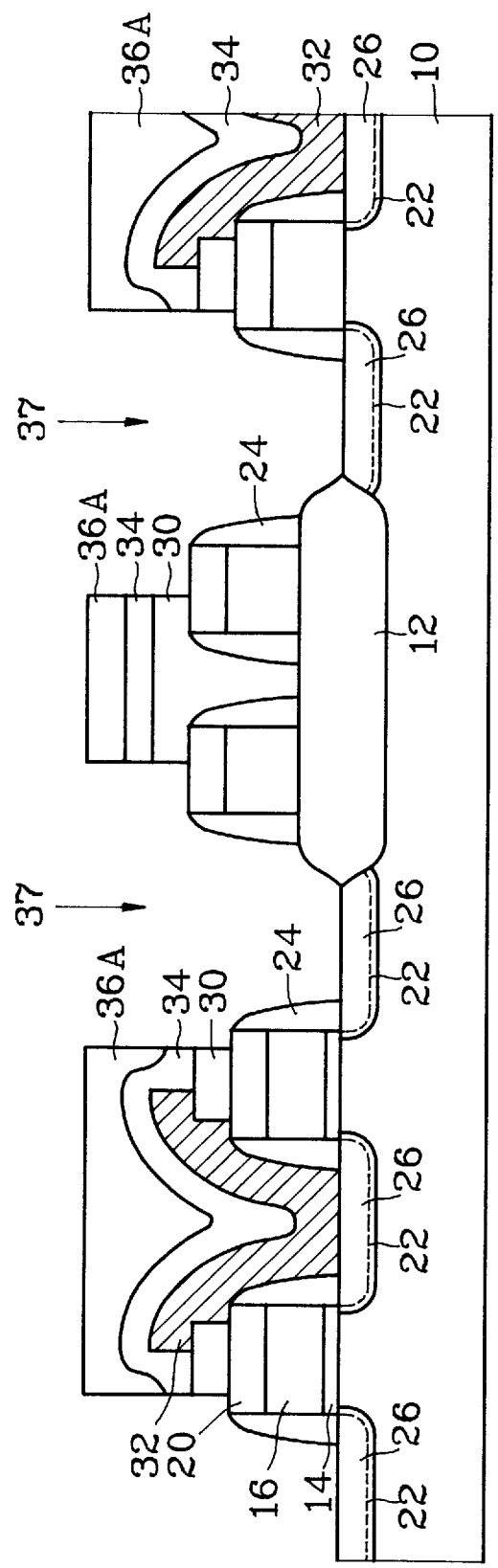
FIG. 5 is a cross sectional view of integrated circuit after the node contacts are formed.

Referring now to FIG. 5, the first second and third dielectric layers are partially etched to open node contact windows 37 with the source regions of the MOSFETs by the conventional lithography and plasma-etching techniques. The plasma-etching process is still using the MERIE, ECR or RIE methods described above.

Figure 6:
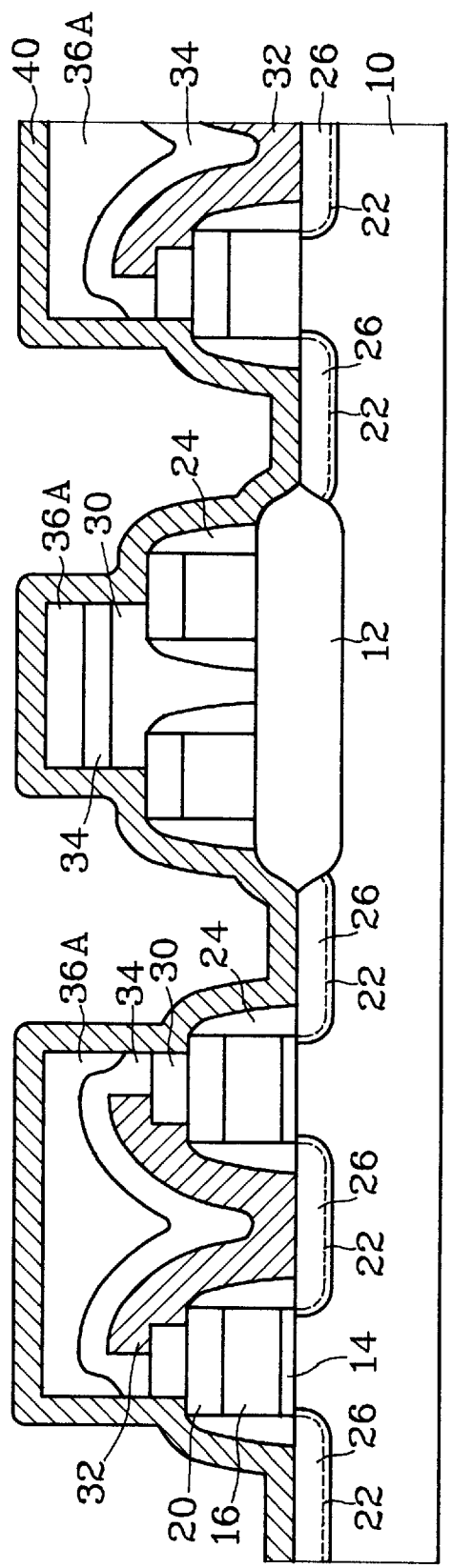
FIG. 6 is a cross sectional view of integrated circuit after the first polysilicon layer is deposited.

Referring now to FIG. 6, the first polysilicon layer 40 is deposited overlaying the entire silicon substrate surface. The first polysilicon layer 40 which is formed by in-situ phosphorus doped LPCVD method at a temperature about 525° to 575° C., has a thickness of 500 to 2000 Angstroms.

Figure 7:
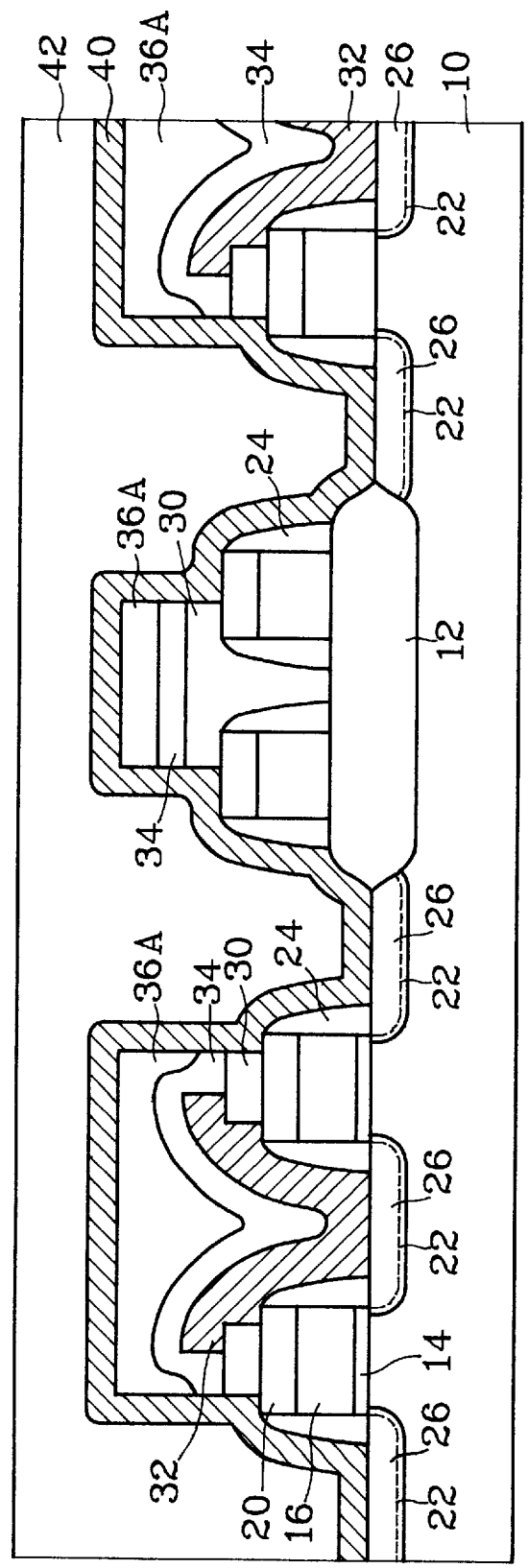
FIG. 7 is a cross sectional view of integrated circuit after the fourth dielectric layer is formed overlaying the first polysilicon layer.

Referring now to FIG. 7, the fourth dielectric layer 42 is deposited overlaying the first polysilicon layer 40. The fourth dielectric layer 42 is usually made of BPSG or NSG which is formed by APCVD technique. The thickness of the fourth dielectric layer 42 is about 3000 to 8000 Angstroms.

Figure 8:
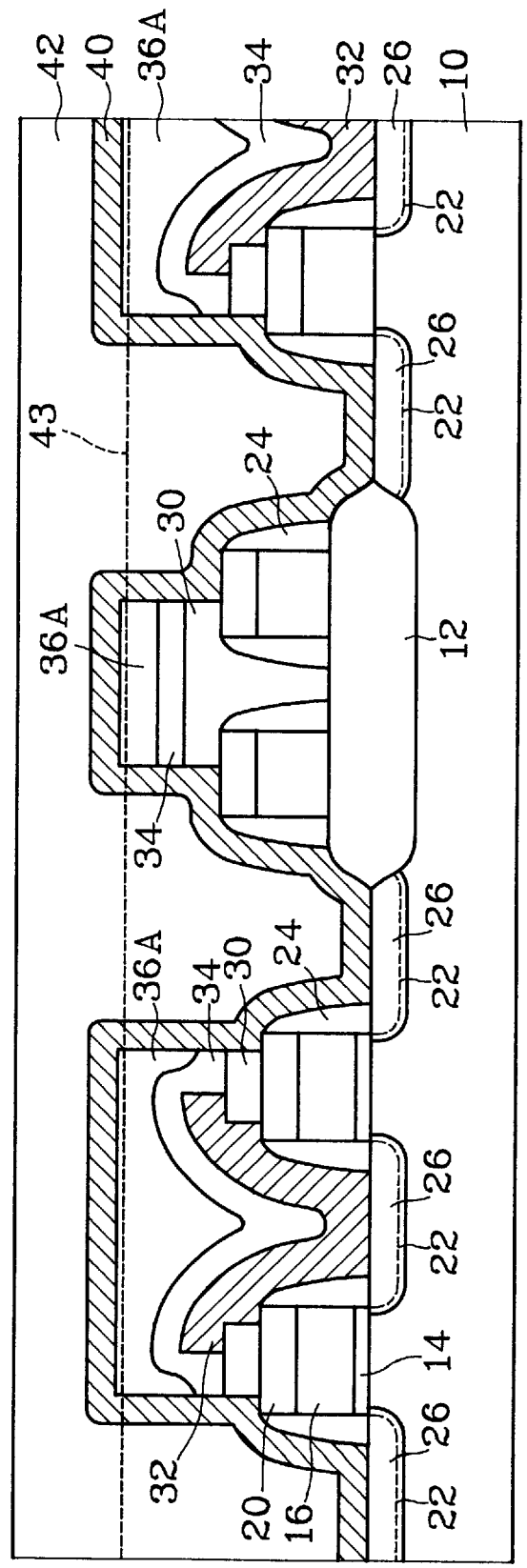
FIG. 8 is a cross sectional view of integrated circuit after the third, fourth dielectric layers and the first polysilicon layer are polished by CMP to form the cylindrical first polysilicon storage nodes.

Referring now to FIG. 8, a portion of the fourth dielectric layer 42, the first polysilicon 40 and the third dielectric 36A are polished by CMP technique to form a smoother surface (dashed line) 43 as shown in FIG. 8. The cylindrical polysilicon storage nodes are formed by CMP technique to self-align without using the extra mask as the conventional method would that is one of the key points of the present invention.

Figure 9:
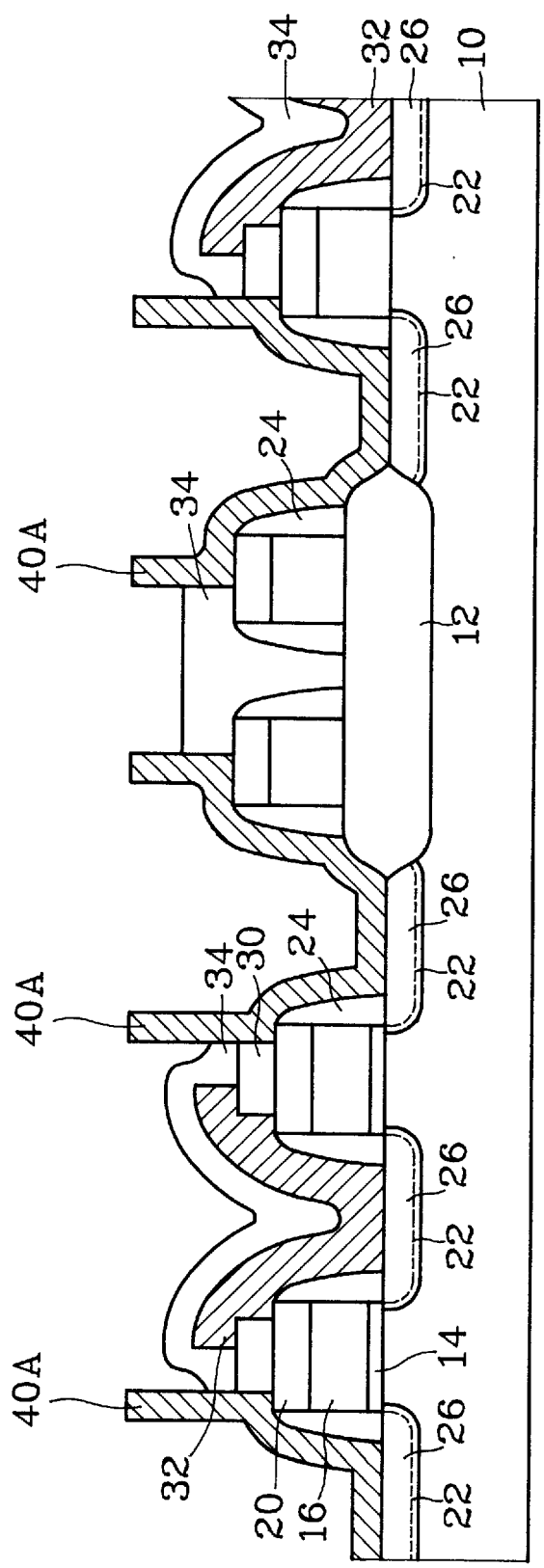
FIG. 9 is a cross sectional view of integrated circuit after the third and fourth dielectric layers are removed by hydrofluoric acid.

Referring now to FIG. 9, the remaining of the third dielectric and fourth dielectric layers are removed by hydrofluoric acid (HF) to expose the first polysilicon storage nodes 40A.

Figure 10:
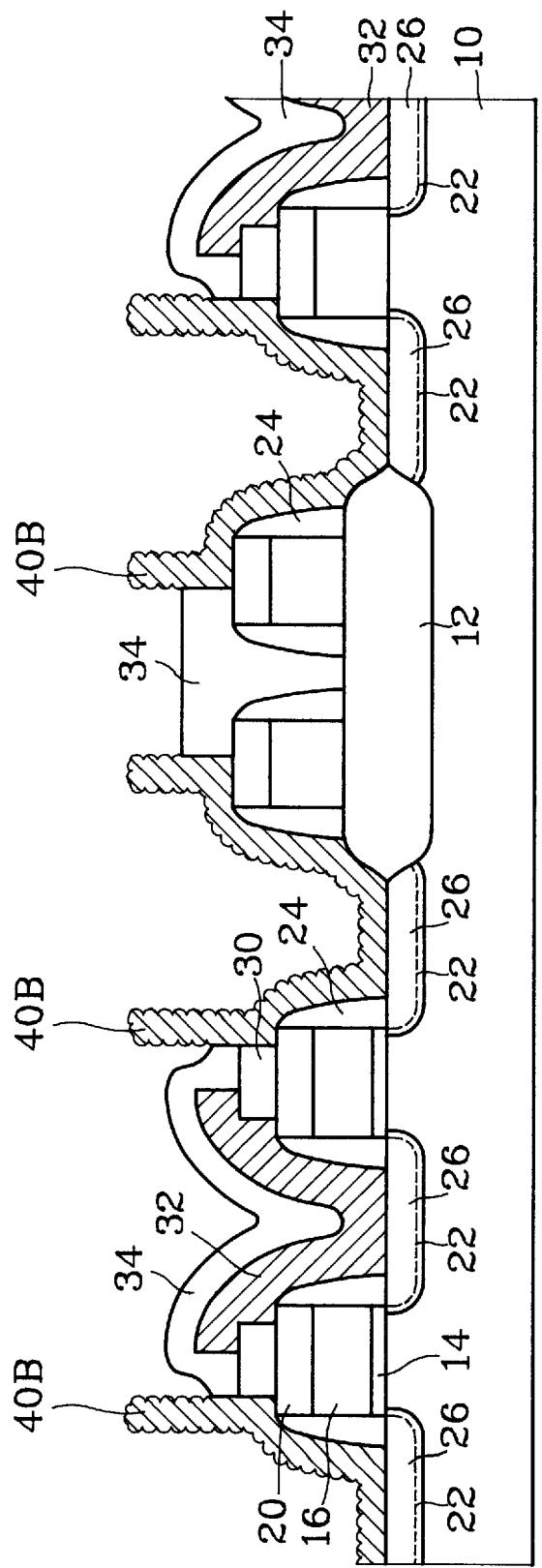
FIG. 10 is a cross sectional view of integrated circuit after the first polysilicon cylindrical storage nodes are treated by hot phosphoric acid to form rugged surface.

Referring now to FIG. 10, this is the most important step of the present invention. The semiconductor silicon substrate 10 is dipped into hot phosphoric acid ($H_3PO_4$) for surface treatment to create the rugged surface of the first polysilicon capacitor storage nodes 40B. These rugged storage nodes further increase the capacitor surface area so as to increase the capacitance value.

Figure 11:
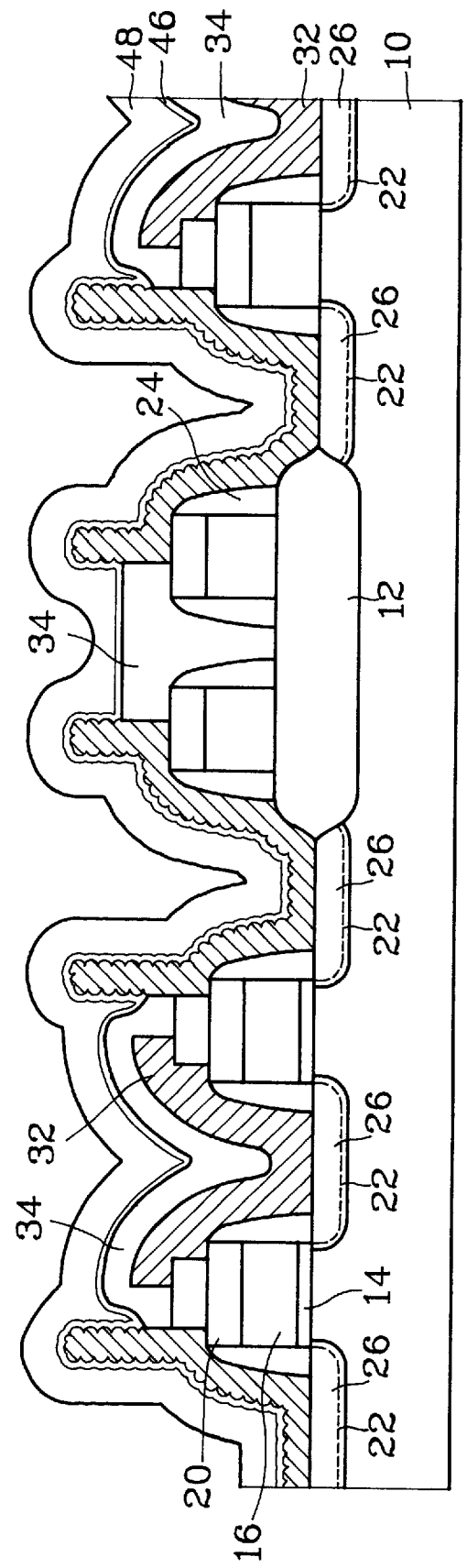
FIG. 11 is a cross sectional view of integrated circuit after the capacitor dielectric and second polysilicon layers are deposited.

Referring now to FIG. 11, the dielectric layer 46 is formed by standard integrated circuit processing procedure. The capacitor dielectric layer 46 is usually using nitride/oxide (NO) double layer or oxide/nitride/oxide (ONO) triple layer or even tantalum oxide ($Ta_2O_5$) material. The thickness of the capacitor dielectric layer 46 is about 20 to 100 Angstroms. The second polysilicon layer 48 is then deposited overlaying the capacitor dielectric layer 46. The thickness of the second polysilicon layer 48 is about 1000 to 2000 Angstroms.

Figure 12:
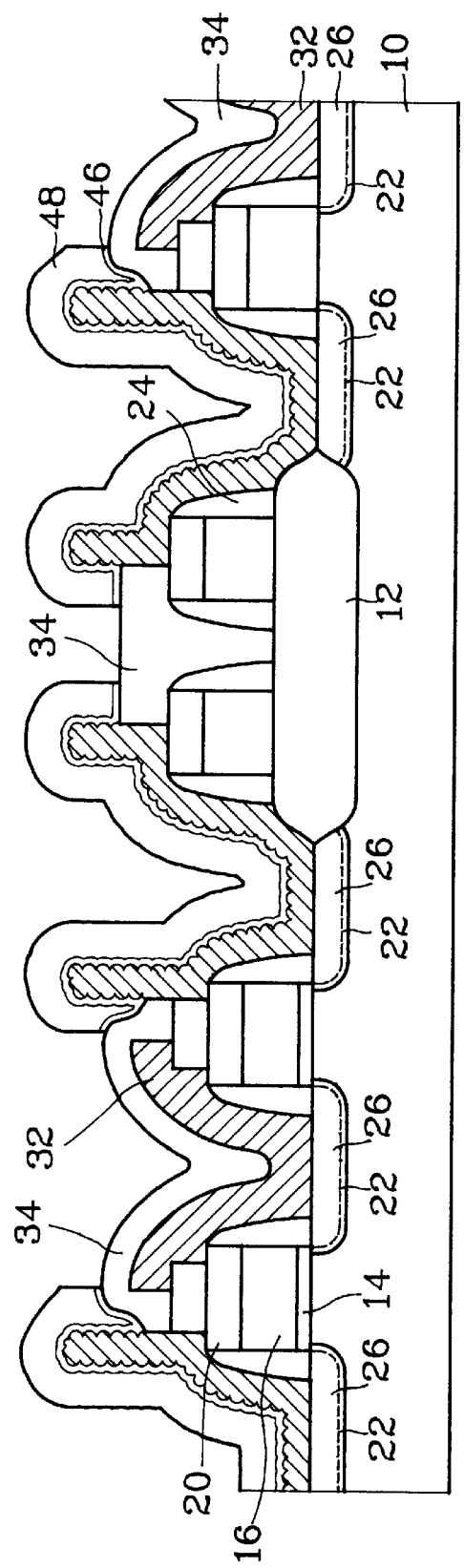
FIG. 12 is a cross sectional view of the final structure of the capacitor after top plates are patterned.

Referring now to FIG. 12, finally, the second polysilicon top electrode 48 and the capacitor dielectric layer 46 are patterned by the conventional lithography and plasma-etching techniques. The second polysilicon plasma-etching process is still using the same conditions as the first polysilicon which is described above. A self-registered cylindrical stack capacitor of high density DRAMs according to the present invention is finally accomplished.

The self-registered cylindrical stack capacitor of high density DRAMs of the present invention has much greater surface area so as to increase the capacitance value of the DRAM capacitor, that can achieve high packing density of the integrated circuit devices.

While the invention has been particularly shown and described with reference to a preferred embodiment, it will be understood by those skilled in the art that various changes in form and detail may be made therein without departing from the spirit and scope of the present invention.

What I claimed is:

1. A method of fabricating at least one capacitor of a DRAM cell, said method comprising the steps of:

(a) forming a field oxide region on a semiconductor silicon substrate;

(b) forming MOSFET structures on said semiconductor silicon substrate, wherein said MOSFET comprises of gate oxide, gate electrode and drain/source regions;

(c) forming a first dielectric layer overlaying the surface of said semiconductor silicon substrate;

(d) etching said first dielectric layer to open bitline contact windows for said drain regions of said MOSFET by conventional lithography and plasma-etching techniques;

(e) forming a plurality of bitlines covering said bitline contact windows;

(f) sequentially forming a second and a third dielectric layer overlaying the entire surface of said silicon substrate;

(g) planarizing said third dielectric layer;

(h) partially etching remaining of said first dielectric layer, said second and said third dielectric layers to open node contact windows for said source region of said MOSFET by conventional lithography and plasma-etching techniques;

(i) depositing a first polysilicon layer overlaying the entire surface of said semiconductor silicon substrate wherein said first polysilicon layer is formed by in-situ doped LPCVD;

(j) forming a fourth dielectric layer overlaying said first polysilicon layer;

(k) planarizing a portion of said first polysilicon, third and fourth dielectric layers by chemical mechanical polishing;

(l) removing the remaining of said third and fourth dielectric layers by HF to expose said first polysilicon layer;

(m) dipping into hot phosphoric acid ($H_3PO_4$) for surface treatment to create a rugged cylindrical storage node surface of said capacitor; and (n) forming a capacitor dielectric layer and a second polysilicon top plate of said capacitor overlaying said first polysilicon storage node by standard integrated circuit processing procedure.

2. The method of claim 1, further comprising a step of performing surface treatment by hot phosphoric acid to form rugged surface of said first polysilicon storage node prior to the step of forming a capacitor dielectric layer and a second polysilicon top plate of said capacitor overlaying said first polysilicon storage node by standard integrated circuit processing procedure.

3. The method of claim 1, wherein said first dielectric layer is made of undoped silicon dioxide ($SiO_2$), which has a thickness of 500 to 2500 Angstroms.

4. The method of claim 1, wherein said second dielectric layer is made of undoped silicon dioxide ($SiO_2$), which has a thickness of 1000 to 2000 Angstroms.

5. The method of claim 1, wherein said third dielectric layer is made of borophosphosilicate glass (BPSG) or neutral silicate glass (NSG) which has a thickness of 3000 to 6000 Angstroms.

6. The method of claim 1, wherein said fourth dielectric layer is made of borophosphosilicate glass (BPSG) or neutral silicate glass (NSG) which has a thickness of 3000 to 8000 Angstroms.

7. The method of claim 1, wherein said first polysilicon layer has a thickness of 500 to 2000 Angstroms.

8. The method of claim 1, wherein said capacitor dielectric layer is selected form the group comprising of nitride/oxide (NO) doublelayer, oxide/nitride/oxide (ONO) triplelayer and tantalum oxide ($Ta_2O_5$), which have a thickness of 20 to 100 Angstroms.

9. The method of claim 1, wherein said second polysilicon layer has a thickness of 1000 to 2000 Angstroms.

10. A method of forming a polysilicon capacitor structure on a semiconductor silicon substrate having active areas, said method comprising the steps of:

(a) forming a first dielectric layer overlaying the surface of said semiconductor silicon substrate, said first dielectric layer conforming to existing topology;

(b) depositing a first polysilicon layer overlaying said first dielectric layer wherein said first polysilicon layer is formed by in-situ doped LPCVD;

(c) forming a second dielectric layer overlaying said first polysilicon layer;

(d) planarizing a portion of said first polysilicon and said second dielectric layers by chemical mechanical polishing;

(e) removing the remaining of said second dielectric layer by HF to expose said first polysilicon layer;

(f) dipping into hot phosphoric acid ($H_3PO_4$) for surface treatment to create a rugged cylindrical storage node surface of said capacitor; and (g) forming a capacitor dielectric layer and a second polysilicon top plate of said capacitor overlaying said first polysilicon storage node by standard integrated circuit processing procedure.

11. The method of claim 10, further comprising a step of performing surface treatment by hot phosphoric acid to form rugged surface of said first polysilicon storage node prior to the step of forming a capacitor dielectric layer and a second polysilicon top plate of said capacitor overlaying said first polysilicon storage node by standard integrated circuit processing procedure.

12. The method of claim 10, wherein said first dielectric layer is made of undoped silicon dioxide ($SiO_2$), which has a thickness of 500 to 2500 Angstroms.

13. The method of claim 10, wherein said second dielectric layer is made of borophosphosilicate glass (BPSG) or neutral silicate glass (NSG) which has a thickness of 3000 to 8000 Angstroms.

14. The method of claim 10, wherein said first polysilicon layer has a thickness of 500 to 2000 Angstroms.

15. The method of claim 10, wherein said capacitor dielectric layer is selected form the group comprising of nitride/oxide (NO) doublelayer, oxide/nitride/oxide (ONO) triplelayer and tantalum oxide ($Ta_2O_5$), which have a thickness of 20 to 100 Angstroms.

16. The method of claim 10, wherein said second polysilicon layer has a thickness of 1000 to 2000 Angstroms.

17. The process of claim 1 wherein step (m) comprises creating a rugged cylindrical storage node surface of said capacitor by a surface treatment consisting essentially of dipping said surface into hot phosphoric acid.

18. The process of claim 10 wherein step (f) comprises creating a rugged cylindrical storage node surface of said capacitor by a surface treatment consisting essentially of dipping said surface into hot phosphoric acid.

* * * * *